United States Patent
Zhou

(10) Patent No.: US 10,290,640 B1
(45) Date of Patent: May 14, 2019

(54) STATIC RANDOM ACCESS MEMORY CELL AND STATIC MEMORY CIRCUIT

(71) Applicant: UNITED MICROELECTRONICS CORP., Hsin-Chu (TW)

(72) Inventor: Zhibiao Zhou, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/790,035

(22) Filed: Oct. 22, 2017

(51) Int. Cl.
*H01L 27/11* (2006.01)
*G11C 11/412* (2006.01)

(52) U.S. Cl.
CPC ........ *H01L 27/1104* (2013.01); *G11C 11/412* (2013.01)

(58) Field of Classification Search
CPC .............................. H01L 27/1104; G11C 11/412
See application file for complete search history.

(56) References Cited

U.S. PATENT DOCUMENTS

| | | |
|---|---|---|
| 6,071,799 A | 6/2000 | Park |
| 6,174,803 B1 | 1/2001 | Harvey |
| 6,797,611 B1 | 9/2004 | Wu |
| 7,023,056 B2 * | 4/2006 | Liaw ............... G11C 11/412 257/369 |
| 9,147,576 B2 | 9/2015 | Horak |
| 9,728,454 B1 | 8/2017 | Zhou |
| 2006/0263985 A1 | 11/2006 | Kang |
| 2006/0264057 A1 | 11/2006 | Manning |
| 2016/0211251 A1 * | 7/2016 | Liaw ............... H01L 27/0207 |
| 2016/0284705 A1 * | 9/2016 | Chung ............ H01L 27/0924 |

OTHER PUBLICATIONS

Zhou, Title of Invention: Layout of Semiconductor Device, U.S. Appl. No. 15/409,498, filed Jan. 18, 2017.

* cited by examiner

*Primary Examiner* — Allison Bernstein
(74) *Attorney, Agent, or Firm* — Winston Hsu

(57) ABSTRACT

A 6T SRAM cell includes a substrate having thereon a first pull-up (PU-1) transistor, a first pull-down (PD-1) transistor, a second pull-up (PU-2) transistor, and a second pull-down (PD-2) transistor. A first contact hard mask partially overlaps with a source diffusion region of the PU-1 transistor. A second contact hard mask partially overlaps with a first gate and a source diffusion region of the PD-1 transistor. A first contact plug partially lands on the first contact hard mask and partially lands on the source diffusion region of the PU-1 transistor. A second contact plug partially lands on the second contact hard mask and partially lands on the source diffusion region of the PD-1 transistor.

15 Claims, 7 Drawing Sheets

STATIC RANDOM ACCESS MEMORY CELL AND STATIC MEMORY CIRCUIT

BACKGROUND OF THE INVENTION

1. Field of the Invention

The present invention relates generally to the field of semiconductor technology. More particularly, the present invention relates to a six transistor static random access memory (6T SRAM) cell structure.

2. Description of the Prior Art

The six transistor static random access memory (6T SRAM) cell is the primary memory used in microprocessor circuits. As is well known to those of ordinary skill in the art, continued efforts are being made to design integrated circuit chips having the greatest possible number of individual 6TSRAM cells, in order to provide the integrated circuit chip with as much memory as possible within the available area thereon. To achieve this goal, integrated circuit designers have been developing layouts for the transistors making up the cells to reduce the area required for each.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. A typical SRAM uses six MOSFETs to store each memory bit.

The first inverter and the second inverter are cross-coupled. That is, the first inverter has an input connected to the output of the second inverter. Likewise, the second inverter has an input connected to the output of the first inverter. The output of the first inverter is referred to as a storage node SN. Likewise, the output of the second inverter is referred to as a storage node SNB. In a normal operating mode, the storage node SN is in the opposite logic state as the storage node SNB. By employing the two cross-coupled inverters, the SRAM cell can hold the data using a latched structure so that the stored data will not be lost without applying a refresh cycle as long as power is supplied.

SUMMARY OF THE INVENTION

It is one object of the invention to provide an improved six transistor static random access memory (6T SRAM) cell, which can provide extra metal routine under the first metal (M1) layer, offer compact design, and have smaller cell size and better contact-to-poly process window.

According to one aspect of the invention, a static memory circuit includes a first inverter comprising a first pull-up (PU-1) transistor and a first pull-down (PD-1) transistor; a second inverter cross-coupled to the first inverter, the second inverter comprising a second pull-up (PU-2) transistor and a second pull-down (PD-2) transistor; a first shared contact plug electrically connecting a gate of the PU-2 transistor, a drain of the PU-1 transistor, and a drain of the PD-1 transistor; and a second shared contact plug electrically connecting a gate of the PU-1 transistor, a drain of the PU-2 transistor, and a drain of the second pull-down transistor.

According to one aspect of the invention, a static memory cell structure includes a substrate having thereon a first active area, a second active area, a third active area, and a fourth active area, wherein the first active area, the second active area, the third active area, and the fourth active area extend along a first direction and are separated from one another; a first gate extending along a second direction, traversing across the first active area to constitute a first pull-up (PU-1) transistor therein, and traversing across the second active area to constitute a first pull-down (PD-1) transistor therein; a second gate extending along the second direction, traversing across the third active area to constitute a second pull-up (PU-2) transistor therein, and traversing across the fourth active area to constitute a second pull-down (PD-2) transistor therein; a first shared contact plug electrically connecting the second gate, a drain diffusion region of the PU-1 transistor, and a drain diffusion region of the PD-1 transistor; and a second shared contact plug electrically connecting the first gate, a drain diffusion region of the PU-2 transistor, and a drain diffusion region of the second pull-down transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a schematic top view showing a six transistor static random access memory (6T SRAM) cell according to one embodiment of the invention.

FIG. 2 is a schematic, cross-sectional view taken along line I-I' in FIG. 1.

FIG. 3 is a schematic top view showing a 6T SRAM cell and the arrangement of $V_0$ via according to one embodiment of the invention.

FIG. 4 is a schematic top view showing a 6T SRAM cell and the arrangement of metal pads and word line in a first metal (M1) layer according to one embodiment of the invention.

FIG. 5 is a schematic top view showing a 6T SRAM cell and the arrangement of $V_1$ via according to one embodiment of the invention.

FIG. 6 is a schematic top view showing a 6T SRAM cell and the arrangement of interconnect layout in a second metal (M2) layer according to one embodiment of the invention.

FIG. 7 is an equivalent circuit diagram of a static random access memory (SRAM) cell according to an embodiment of the present invention.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

As described in the embodiments herein, steps such as deposition, patterning or etching of various films (including conductive films, metals, dielectric layers, etc.) can be accomplished using known processes such as chemical vapor deposition, physical vapor deposition, sputtering, atomic layer deposition, optical lithography processes, plasma dry etching, wet etching, reactive ion etching, and the like, the details of which will not be repeated.

The term "active area" would be commonly known in this technical field to be defined as a region on a silicon main surface of a substrate other than a local oxidation of silicon (LOCOS) or a shallow trench isolation (STI) region.

Figure 7:
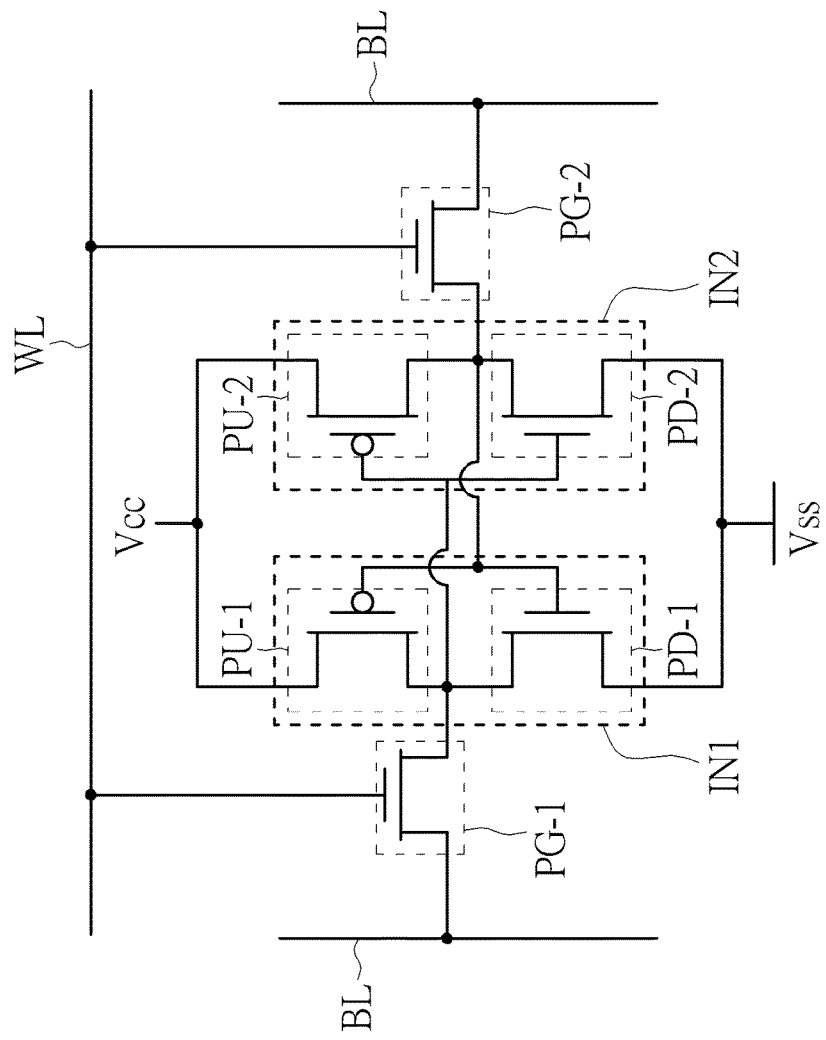

Please refer to FIG. 7, which is a schematic diagram illustrating a circuit of a static random access memory (SRAM) cell according to an embodiment of the present invention. As shown in FIG. 7, there is provided a six-transistor SRAM (6T-SRAM) including a first inverter IN1, a second inverter IN2, a first pass-gate transistor PG-1 and a second pass-gate transistor PG-2.

In this embodiment, the first inverter IN1 includes a first pull-up transistor PU-1 and a first pull-down transistor PD-1, and the second inverter IN2 includes a second pull-up transistor PU-2 and a second pull-down transistor PD-2. The first pull-up transistor PU-1 and the second pull-up transistor PU-2 are p-type field effect transistor (pFET), such as p-type metal-oxide-semiconductor field effect transistor (PMOS-FET), and the first pull-down transistor PD-1 and the second pull-down transistor PD-2 are n-type FET (nFET), such as n-type metal-oxide-semiconductor field effect transistor (NMOSFET).

A drain and a gate of the first pull-up transistor PU-1 are electrically connected to a drain and a gate of the first pull-down transistor PD-1 respectively, so that the first pull-up transistor PU-1 and the first pull-down transistor PD-1 constitute the first inverter IN1. A source of the first pull-up transistor PU-1 is electrically connected to a high power line Vcc, such as a voltage power source. A source of the first pull-down transistor PD-1 is electrically connected to a low power line Vss, such as ground.

Likewise, a drain and a gate of the second pull-up transistor PU-2 are electrically connected to a drain and a gate of the second pull-down transistor PD-2 respectively, so that the second pull-up transistor PU-2 and the second pull-down transistor PD-2 constitute the second inverter IN2. A source of the second pull-up transistor PU-2 and a source of the second pull-down transistor PD-2 are electrically connected to the high power line Vcc and the low power line Vss respectively.

Furthermore, a drain of the first pass-gate transistor PG-1 is electrically connected to an output of the first inverter IN1 that is the drain of the first pull-up transistor PU-1 and the drain of the first pull-down transistor PD-1 and an input of the second inverter IN2 that is the gate of the second pull-up transistor PU-2 and the gate of the second pull-down transistor PD-2. Likewise, a drain is electrically connected to an output of the second inverter IN2 which is the drain of the second pull-up transistor PU-2 and the drain of the second pull-down transistor PD-2 and an input of the first inverter IN1 that is the gate of the first pull-up transistor PU-1 and the gate of the first pull-down transistor PD-1.

A gate of the first pass-gate transistor PG-1 and a gate of the second pass-gate transistor PG-2 are electrically connected to a word line WL. A source of the first pass-gate transistor PG-1 and a source of the second pass-gate transistor PG-2 are electrically connected to corresponding bit lines BL respectively.

Figure 1:
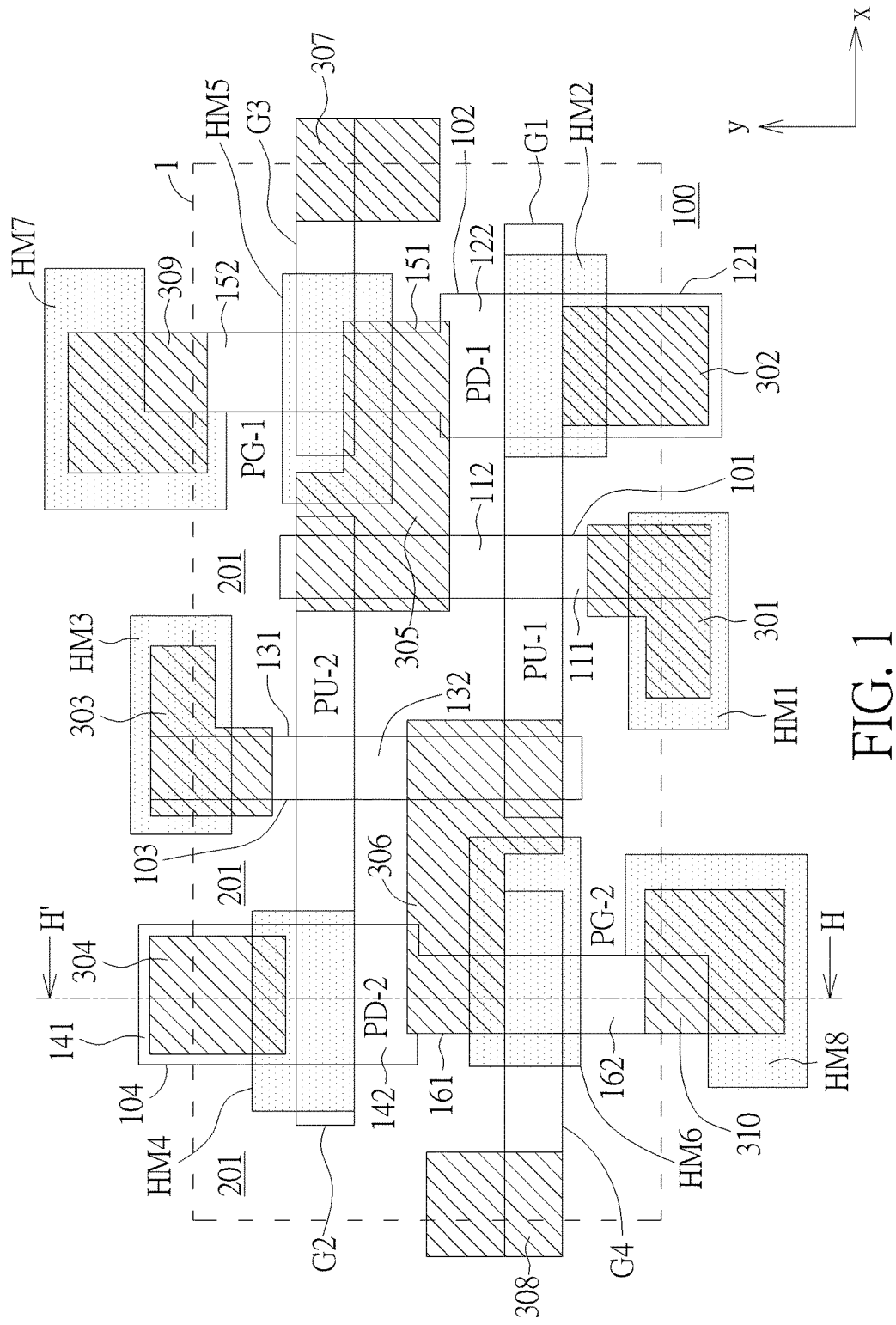
Figure 2:
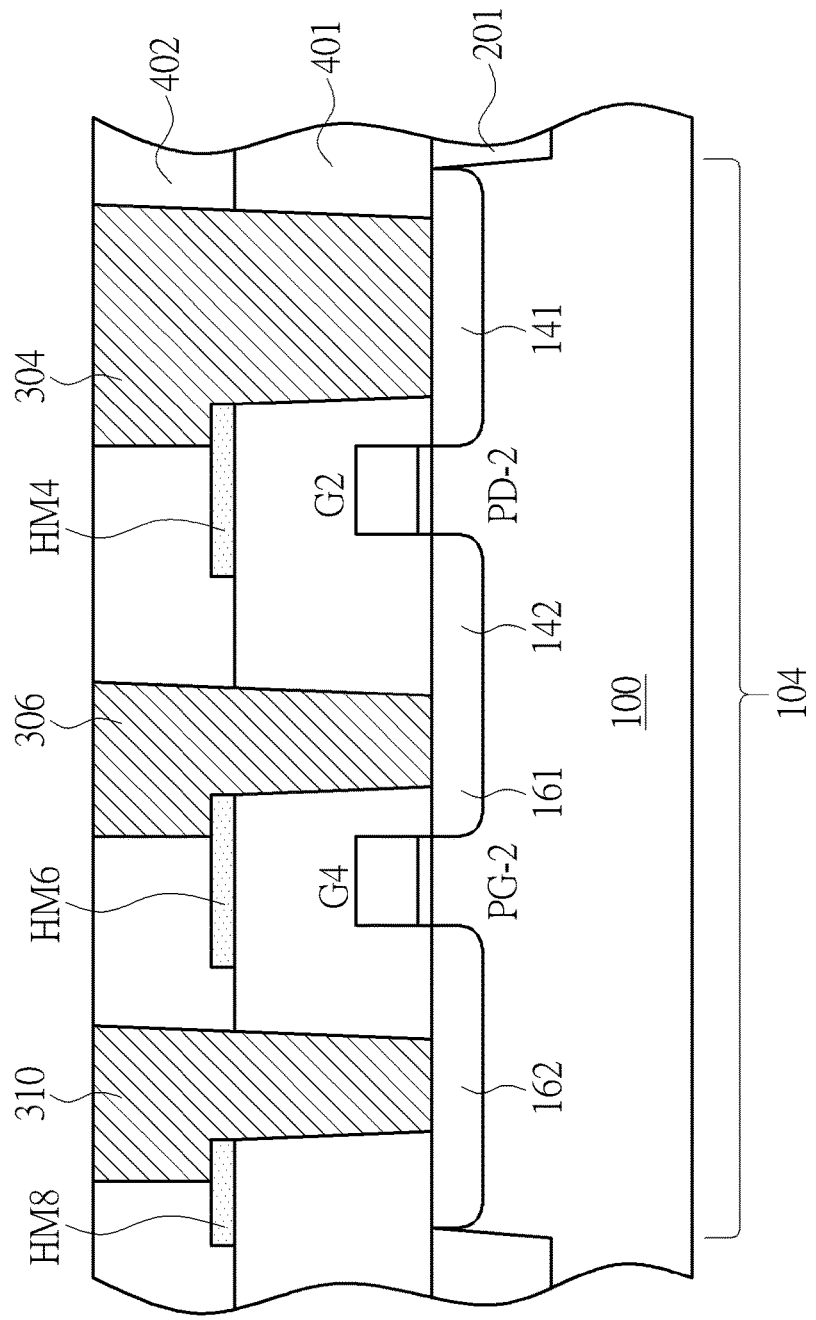

Please refer to FIG. 1 and FIG. 2. FIG. 1 is a schematic layout structure of a six transistor static random access memory (6T SRAM) cell and the related positions of the contact plugs according to one embodiment of the invention. FIG. 2 is a schematic, cross-sectional view taken along line I-I' in FIG. 1.

As shown in FIG. 1 and FIG. 2, the 6T SRAM cell 1, as indicated by the dashed line, comprises a substrate 100 such as a silicon substrate, but is not limited thereto. A first active area 101, a second active area 102, a third active area 103, and a fourth active area 104 are formed on the substrate 100. The first active area 101, the second active area 102, the third active area 103, and the fourth active area 104 may be of a stripe shape and may extend along a first direction (i.e. the reference y-axis direction). The first active area 101, the second active area 102, the third active area 103, and the fourth active area 104 are separated from one another by shallow trench isolation (STI) region 201.

A first gate G1 extends along a second direction (i.e. the reference x-axis direction) and traverses across the first active area 101 to form a first pull-up (PU-1) transistor therein. The first gate G1 traverses across the second active area 102 to form a first pull-down (PD-1) transistor therein. A second gate G2 extends along the second direction (i.e. the reference x-axis direction) and traverses across the third active area 103 to form a second pull-up (PU-2) transistor therein. The second gate G2 traverses across the fourth active area 104 to form a second pull-down (PD-2) transistor therein.

A third gate G3 extends in the second direction (i.e. the reference x-axis direction) and traverses across the second active area 102 to forma first pass-gate (PG-1) transistor therein. A fourth gate G4 extends in the second direction (i.e. the reference x-axis direction) and traverses across the fourth active area 104 to form a second pass-gate (PG-2) transistor therein.

According to one embodiment of the invention, a first inter-layer dielectric (ILD) layer 401 may be deposited over the substrate 100 and covers the first gate G1, the second gate G2, the third gate G3, and the fourth gate G4.

According to one embodiment of the invention, a first contact hard mask HM1 and a second contact hard mask HM2 are disposed on the first ILD layer. The first contact hard mask HM1 partially overlaps with a distal end portion of a source diffusion region 111 of the PU-1 transistor. The first contact hard mask HM1 does not overlap with the contact portion of the source diffusion region 111 between the end portion of source diffusion region 111 and the edge of the first gate G1.

According to one embodiment of the invention, the first contact hard mask HM1 may have a rectangular shape with its lengthwise direction being in parallel with the second direction (i.e. the reference x-axis direction). According to one embodiment of the invention, only the right side of the first contact hard mask HM1 overlaps with the distal end portion of the source diffusion region 111 of the PU-1 transistor.

According to one embodiment of the invention, the second contact hard mask HM2 partially overlaps with the first gate G1 and a portion of a source diffusion region 121 of the PD-1 transistor that is adjacent to the first gate G1.

According to one embodiment of the invention, the second contact hard mask HM2 may have a rectangular shape with its lengthwise direction being in parallel with the second direction (i.e. the reference x-axis direction). According to one embodiment of the invention, the second contact hard mask HM2 does not overlap with a distal end contact portion of the source diffusion region 121 of the PD-1 transistor.

According to one embodiment of the invention, a third contact hard mask HM3 partially overlaps with a source diffusion region 131 of the PU-2 transistor. Likewise, the third contact hard mask HM3 may have a rectangular shape with its lengthwise direction being in parallel with the second direction (i.e. the reference x-axis direction). According to one embodiment of the invention, only the left side of the third contact hard mask HM3 overlaps with the distal end portion of the source diffusion region 131 of the PU-2 transistor.

According to one embodiment of the invention, a fourth contact hard mask HM4 partially overlaps with the second gate G2 and a source diffusion region 141 of the PD-2 transistor. The fourth contact hard mask HM4 may have a rectangular shape with its lengthwise direction being in parallel with the second direction (i.e. the reference x-axis direction). According to one embodiment of the invention, the fourth contact hard mask HM4 does not overlap with a distal end contact portion of the source diffusion region 141 of the PD-2 transistor.

According to one embodiment of the invention, as can be best seen in FIG. 2, a second inter-layer dielectric (ILD) layer 402 may be deposited to cover the first contact hard mask HM1, second contact hard mask HM2, the third contact hard mask HM3, the fourth contact hard mask HM4, and the first ILD layer.

According to one embodiment of the invention, a first contact plug 301, a second contact plug 302, a third contact plug 303 and a fourth contact plug 304 may be formed in the second ILD layer 401 and the first ILD layer 402.

The first contact plug 301 partially lands on the first contact hard mask HM1 and partially lands on the source diffusion region 111 of the PU-1 transistor. The second contact plug 302 partially lands on the second contact hard mask HM2 and partially lands on the source diffusion region 121 of the PD-1 transistor. The third contact plug 303 partially lands on the third contact hard mask HM3 and partially lands on the source diffusion region 131 of the PU-2 transistor. The fourth contact plug 304 partially lands on the fourth contact hard mask HM4 and partially lands on the source diffusion region 141 of the PD-2 transistor.

According to one embodiment of the invention, the source diffusion region 111 of the PU-1 transistor and the source diffusion region 131 of the PU-2 transistor are electrically coupled to a voltage source (Vcc) node. According to one embodiment of the invention, the source diffusion region 121 of the PD-1 transistor and the source diffusion region 141 of the PD-2 transistor are electrically coupled to a ground (Vss) node.

According to one embodiment of the invention, the second gate G2 laterally extends to the first active area 101. The second gate G2 overlaps with the first active area 101. According to one embodiment of the invention, a drain diffusion region 151 of the PG-1 transistor is merged with a drain diffusion region 122 of the PD-1 transistor, and a source diffusion region 152 of the PG-1 transistor is electrically coupled to a first bit line node.

According to one embodiment of the invention, a fifth contact hard mask HM5 partially overlaps with the third gate G3 and the drain diffusion region 151 of the PG-1 transistor. A first shared contact plug 305 partially lands on the fifth contact hard mask HM5 and partially lands on the second gate G2, a drain diffusion region 112 of the PU-1 transistor, and the drain diffusion region 151 of the PG-1 transistor. That is, the second gate G2, the drain diffusion region 112 of the PU-1 transistor, and the drain diffusion region 151 of the PG-1 transistor are interconnected together by the first shared contact plug 305. According to one embodiment of the invention, the fifth contact hard mask HM5 may be formed in the second ILD layer and the first ILD layer.

According to one embodiment of the invention, the drain diffusion region 151 of the PG-1 transistor and the drain diffusion region 122 of the PD-1 transistor are electrically coupled to a first output node.

According to one embodiment of the invention, the first gate G1 laterally extends to the third active area 103. The first gate G1 overlaps with the third active area 103. Likewise, a drain diffusion region 161 of the PG-2 transistor is merged with a drain diffusion region 142 of the PD-2 transistor, and a source diffusion region 162 of the PG-2 transistor is electrically coupled to a second bit line node.

According to one embodiment of the invention, a sixth contact hard mask HM6 partially overlaps with the fourth gate G4 and the drain diffusion region 161 of the PG-2 transistor. A second shared contact plug 306 partially lands on the sixth contact hard mask HM6 and partially lands on the first gate G1, a drain diffusion region 132 of the PU-2 transistor, and the drain diffusion region 161 of the PG-2 transistor.

According to one embodiment of the invention, the drain diffusion region 161 of the PG-2 transistor and the drain diffusion region 142 of the PD-2 transistor are electrically coupled to a second output node.

According to one embodiment of the invention, a drain diffusion region 161 of the PG-2 transistor is merged with a drain diffusion region 142 of the PD-2 transistor, and a source diffusion region 162 of the PG-2 transistor is electrically coupled to a second bit line node.

According to one embodiment of the invention, a sixth contact hard mask HM6 partially overlaps with the fourth gate G4 and the drain diffusion region 161 of the PG-2 transistor. A second shared contact plug 306 partially lands on the sixth contact hard mask HM6 and partially lands on the first gate G1, a drain diffusion region 112 of the PU-2 transistor, and the drain diffusion region 161 of the PG-2 transistor.

According to one embodiment of the invention, the drain diffusion region 161 of the PG-2 transistor and the drain diffusion region 142 of the PD-2 transistor are electrically coupled to a second output node.

According to one embodiment of the invention, a first gate contact plug 307 is disposed on the third gate G3 and a second gate contact plug 308 is disposed on the fourth gate G4.

According to one embodiment of the invention, a seventh contact hard mask HM7 is disposed around a source diffusion region 152 of the PG-1 transistor. A first bit line contact plug 309 partially lands on the seventh contact hard mask HM7 and partially lands on the source diffusion region 152 of the PG-1 transistor.

According to one embodiment of the invention, an eighth contact hard mask HM8 is disposed around a source diffusion region 162 of the PG-2 transistor. A second bit line contact plug 310 partially lands on the eighth contact hard mask HM8 and partially lands on the source diffusion region 162 of the PG-2 transistor.

According to one embodiment of the invention, the PU-1 transistor and the PU-2 transistor are PMOS transistors, while the PD-1 transistor and the PD-2 transistor are NMOS transistors.

Figure 3:
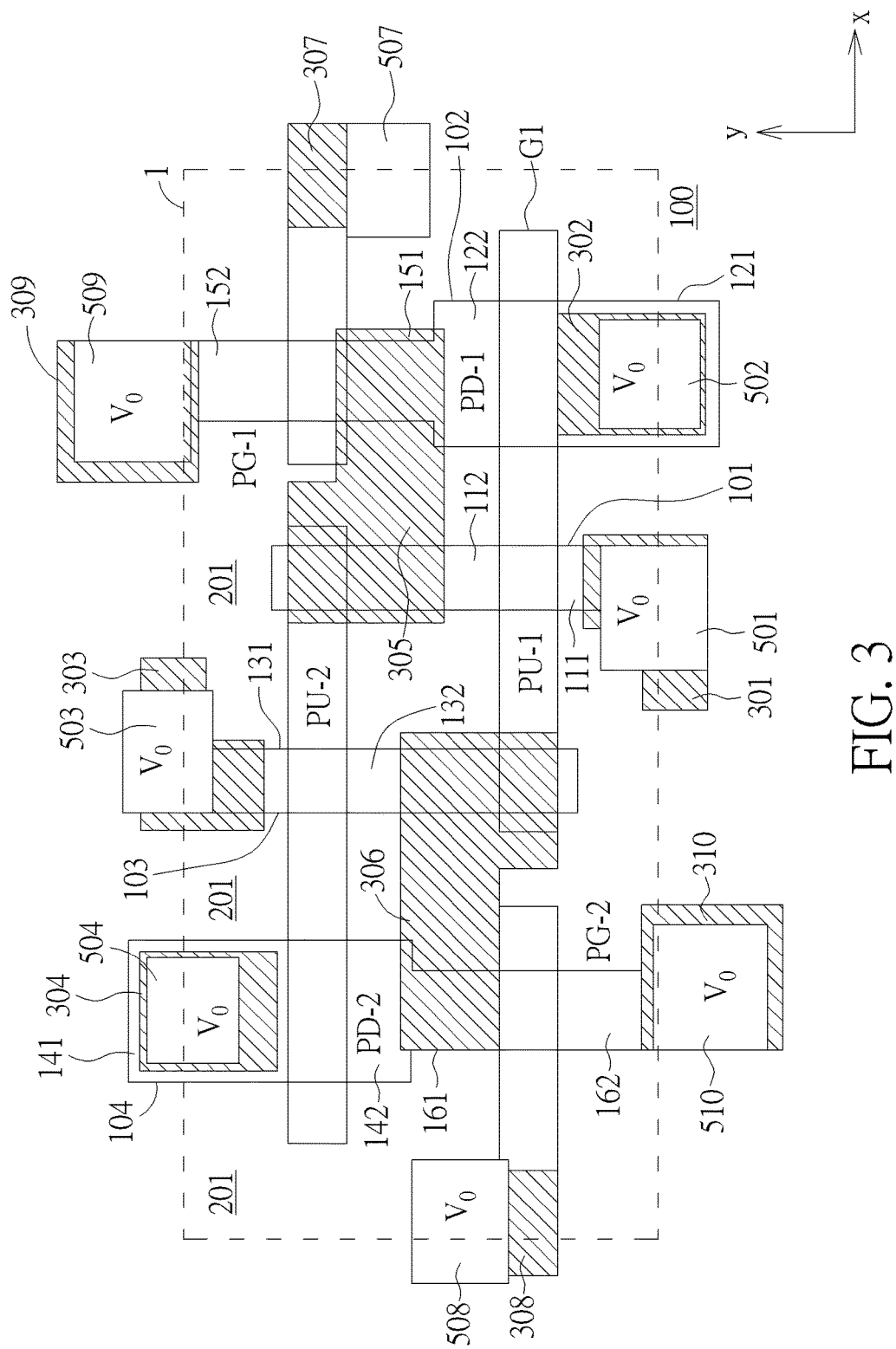

Please refer to FIG. 3. FIG. 3 is a schematic top view showing a 6T SRAM cell and the arrangement of $V_0$ via according to one embodiment of the invention. As shown in FIG. 3, a via 501 is disposed directly on the first contact plug 301, a via 502 is disposed directly on the second contact plug 302, a via 503 is disposed directly on the third contact plug 303, a via 504 is disposed directly on the fourth contact plug 304, a via 507 is disposed directly on the first gate contact plug 307, a via 508 is disposed directly on the second gate contact plug 308, a via 509 is disposed directly on the first bit line contact plug 309, and a via 510 is disposed directly on the second bit line contact plug 310. The via 507 is disposed between the third gate G3 and the first gate G1. The via 508 is disposed between the fourth gate G4 and the second gate G2.

Figure 4:
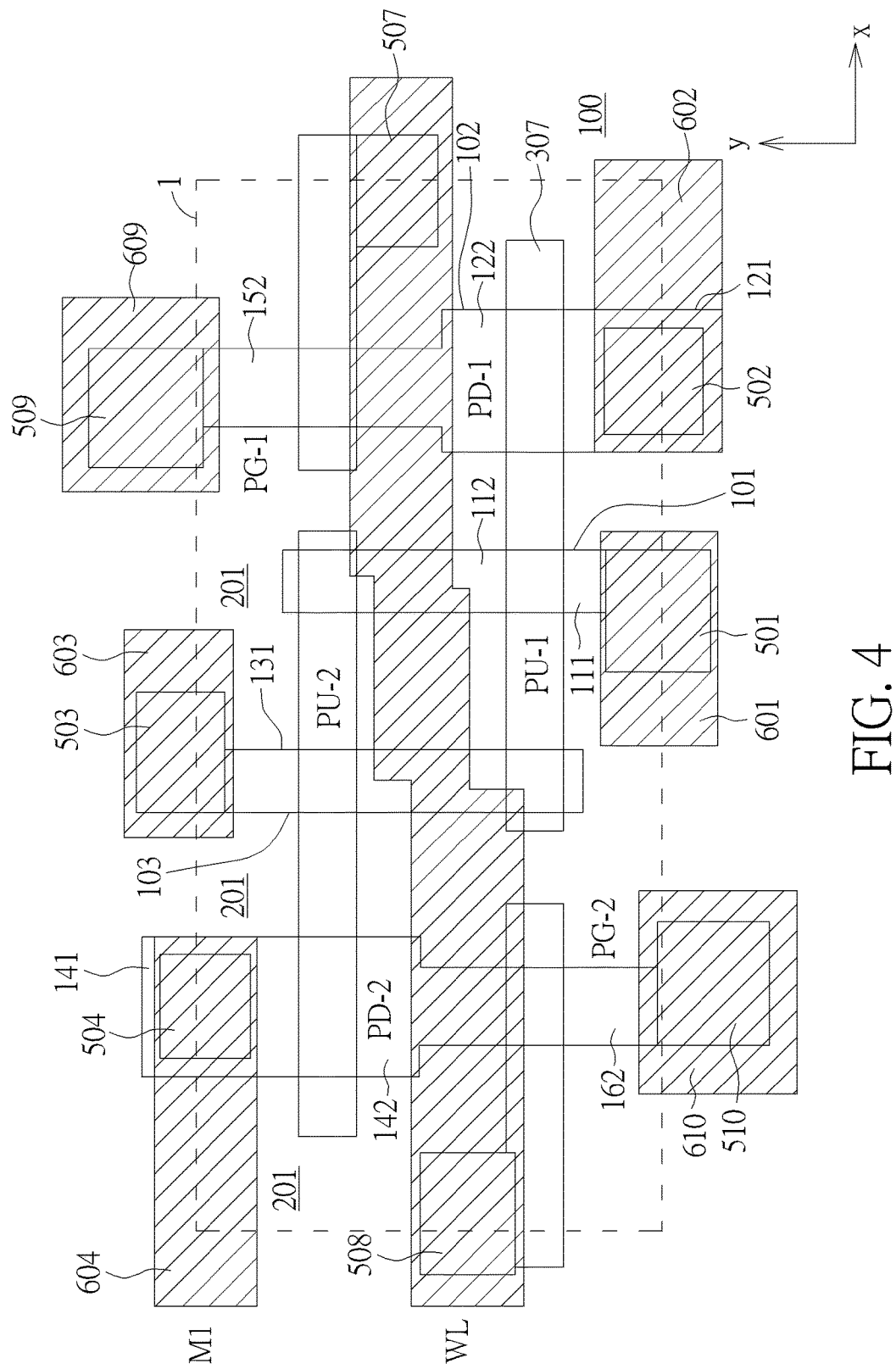

Please refer to FIG. 4. FIG. 4 is a schematic top view showing a 6T SRAM cell and the arrangement of metal pads and word line in a first metal (M1) layer according to one embodiment of the invention. As shown in FIG. 4, a word line WL extends in the second direction in a first metal (M1) layer. The first gate contact plug 307 and the second gate contact plug 308 are interconnected to the word line WL through the via 507 and the via 508, respectively. A metal pad 601 is disposed on the via 501. A metal pad 602 is disposed on the via 502. A metal pad 603 is disposed on the via 503. A metal pad 604 is disposed on the via 504. A metal pad 609 is disposed on the via 509. A metal pad 610 is disposed on the via 510.

Figure 5:
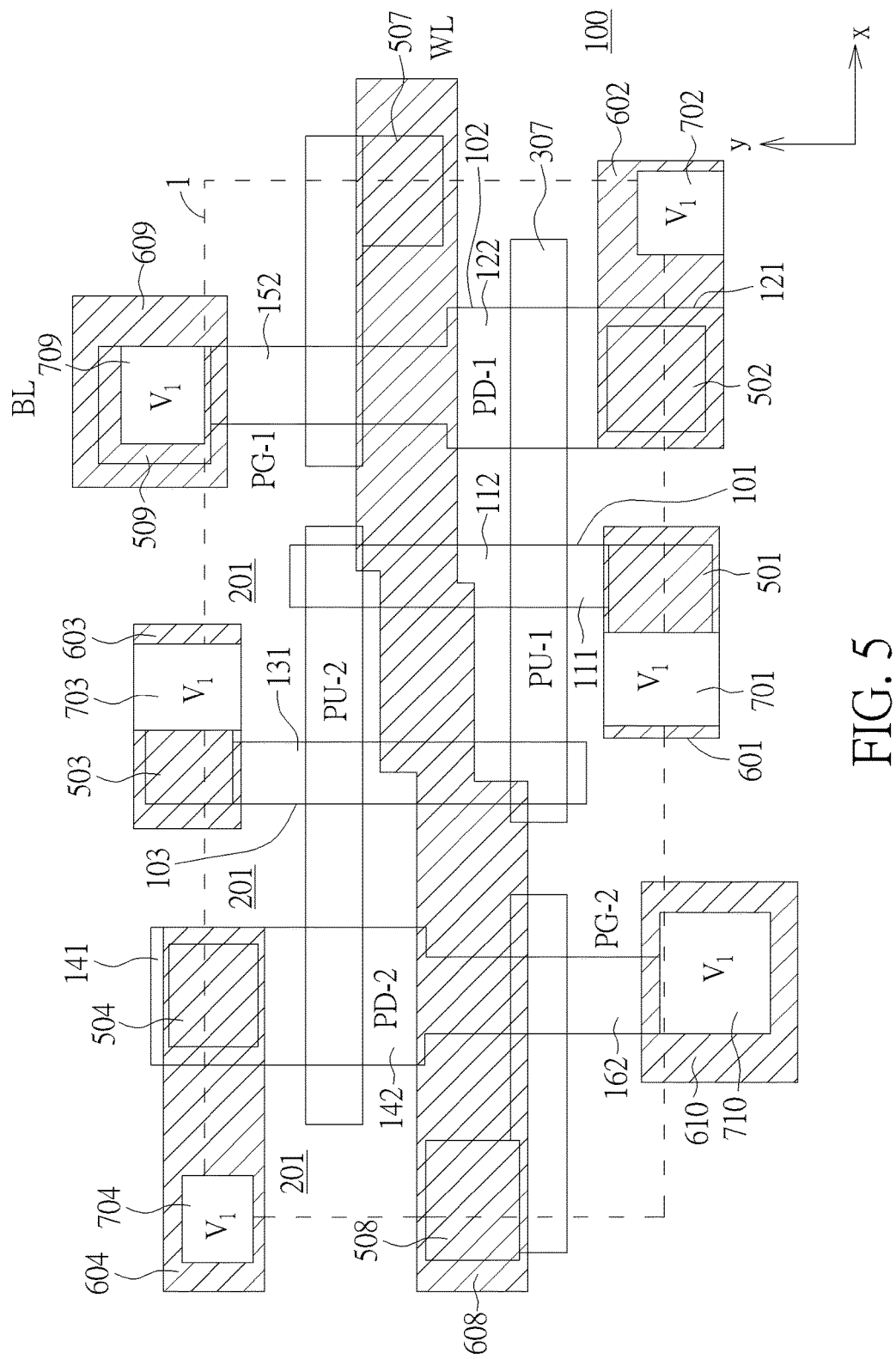

Please refer to FIG. 5. FIG. 5 is a schematic top view showing a 6T SRAM cell and the arrangement of $V_1$ via according to one embodiment of the invention. As shown in FIG. 5, a via 701 is disposed directly on the metal pad 601, a via 702 is disposed directly on the metal 602, a via 703 is disposed directly on the metal pad 603, a via 704 is disposed directly on the metal pad 604, a via 709 is disposed directly on the metal pad 609, and a via 710 is disposed directly on the metal pad 610.

Figure 6:
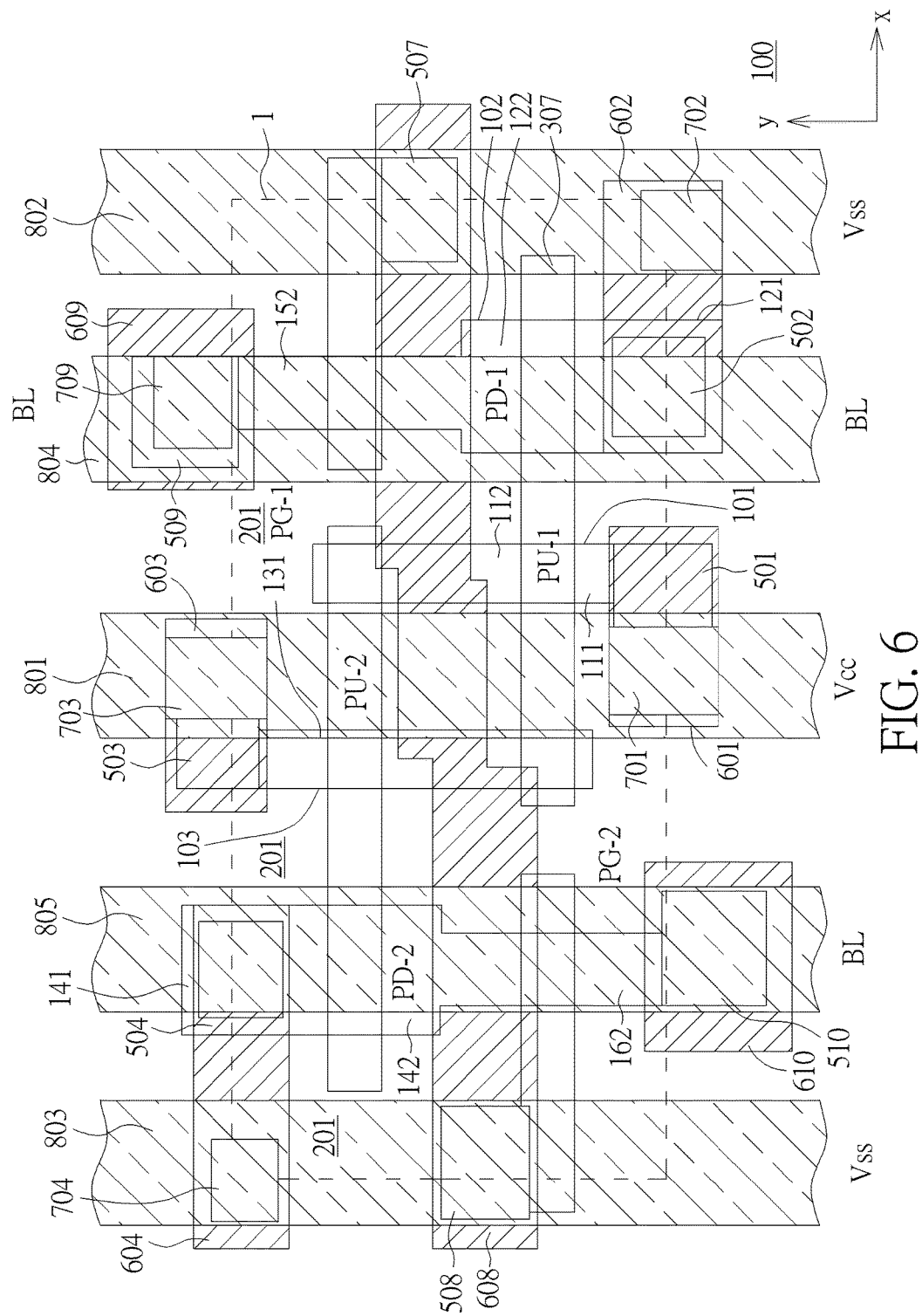

Please refer to FIG. 6. FIG. 6 is a schematic top view showing a 6T SRAM cell and the arrangement of interconnect layout in a second metal (M2) layer according to one embodiment of the invention. As shown in FIG. 6, through the via 501, the metal pad 601, the via 701, the via 503, the metal pad 603, and the via 703, the first contact plug 301 and the third contact plug 303 are interconnected to a $V_{CC}$ voltage supply line 701 extending along the first direction in the M2 layer. Through the via 502, the metal pad 602, and the via 702, the second contact plug 302 is interconnected to a first ground line 802 extending along the first direction in the M2 layer. Through the via 504, the metal pad 604, and the via 704, the fourth contact plug 304 is interconnected to a second ground line 803 extending along the first direction in the M2 layer. Through the via 509, the metal pad 609, and the via 709, the first bit line contact plug 309 is interconnected to a first bit line 804 extending along the first direction in the M2 layer, wherein the first bit line 804 is interposed between the $V_{CC}$ voltage supply line 801 and the first ground line 802. Through the via 510, the metal pad 610, and the via 710, the second bit line contact plug 310 is interconnected to a second bit line 805 extending along the first direction in the M2 layer. The second bit line 805 is interposed between the $V_{CC}$ voltage supply line 801 and the second ground line 803.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static memory cell structure, comprising:
   a substrate having thereon a first active area, a second active area, a third active area, and a fourth active area, wherein the first active area, the second active area, the third active area, and the fourth active area extend along a first direction and are separated from one another;
   a first gate extending along a second direction, traversing across the first active area to constitute a first pull-up (PU-1) transistor therein, and traversing across the second active area to constitute a first pull-down (PD-1) transistor therein;
   a second gate extending along the second direction, traversing across the third active area to constitute a second pull-up (PU-2) transistor therein, and traversing across the fourth active area to constitute a second pull-down (PD-2) transistor therein; and
   a first shared contact plug electrically connecting the second gate, a drain diffusion region of the PU-1 transistor, and a drain diffusion region of the PD-1 transistor, wherein when viewed in a top view, the first shared contact plug is an L-shaped structure, and the L-shaped structure is made of one single conductive layer; and
   a fifth contact hard mask partially overlapping with the drain diffusion region of the PD-1 transistor, wherein the first shared contact plug partially lands on the fifth contact hard mask.

2. The static memory cell structure according to claim 1 further comprising:
   a second shared contact plug electrically connecting the first gate, a drain diffusion region of the PU-2 transistor, and a drain diffusion region of the second pull-down transistor.

3. The static memory cell structure according to claim 2 further comprising:
   a first contact hard mask partially overlapping with a source diffusion region of the PU-1 transistor;
   a first contact plug partially landing on the first contact hard mask and partially landing on the source diffusion region of the PU-1 transistor;
   a second contact hard mask partially overlapping with the first gate and a source diffusion region of the PD-1 transistor; and
   a second contact plug partially landing on the second contact hard mask and partially landing on the source diffusion region of the PD-1 transistor.

4. The static memory cell structure according to claim 3 further comprising:
   a third contact hard mask partially overlapping with a source diffusion region of the PU-2 transistor;
   a third contact plug partially landing on the third contact hard mask and partially landing on the source diffusion region of the PU-2 transistor;
   a fourth contact hard mask partially overlapping with the second gate and a source diffusion region of the PD-2 transistor; and
   a fourth contact plug partially landing on the fourth contact hard mask and partially landing on the source diffusion region of the PD-2 transistor.

5. The static memory cell structure according to claim 4 further comprising:
 a third gate extending in the second direction and traversing across the second active area to constitute a first pass-gate (PG-1) transistor therein, wherein a drain diffusion region of the PG-1 transistor is merged with the drain diffusion region of the PD-1 transistor, and a source diffusion region of the PG-1 transistor is electrically coupled to a first bit line node; and
 the fifth contact hard mask partially overlapping with the third gate and the drain diffusion region of the PG-1 transistor.

6. The static memory cell structure according to claim 5 further comprising:
 a fourth gate extending in the second direction and traversing across the fourth active area to constitute a second pass-gate (PG-2) transistor therein, wherein a drain diffusion region of the PG-2 transistor is merged with the drain diffusion region of the PD-2 transistor, and a source diffusion region of the PG-2 transistor is electrically coupled to a second bit line node; and
 a sixth contact hard mask partially overlapping with the fourth gate and the source diffusion region of the PG-2 transistor, wherein the second shared contact plug partially lands on the sixth contact hard mask and partially lands on the first gate, the drain diffusion region of the PU-2 transistor, and the drain diffusion region of the PG-2 transistor.

7. The static memory cell structure according to claim 6 further comprising a first gate contact plug on the third gate and a second gate contact plug on the fourth gate.

8. The static memory cell structure according to claim 7, wherein the first gate contact plug and the second gate contact plug are interconnected to a word line extending in the second direction in a first metal (M1) layer.

9. The static memory cell structure according to claim 8, wherein the first contact plug and the third contact plug are interconnected to a $V_{CC}$ voltage supply line extending along the first direction in a second metal (M2) layer.

10. The static memory cell structure according to claim 9, wherein the second contact plug is interconnected to a first ground line extending along the first direction in the M2 layer, and wherein the fourth contact plug is interconnected to a second ground line extending along the first direction in the M2 layer.

11. The static memory cell structure according to claim 10 further comprising:
 a seventh contact hard mask being disposed around a source diffusion region of the PG-1 transistor; and
 a first bit line contact plug partially landing on the seventh contact hard mask and partially landing on the source diffusion region of the PG-1 transistor.

12. The static memory cell structure according to claim 11, wherein the first bit line contact plug is interconnected to a first bit line extending along the first direction in the M2 layer, wherein the first bit line is interposed between the $V_{CC}$ voltage supply line and the first ground line.

13. The static memory cell structure according to claim 12 further comprising:
 an eighth contact hard mask being disposed around a source diffusion region of the PG-2 transistor; and
 a second bit line contact plug partially landing on the eighth contact hard mask and partially landing on the source diffusion region of the PG-2 transistor.

14. The static memory cell structure according to claim 13, wherein the second bit line contact plug is interconnected to a second bit line extending along the first direction in the M2 layer, wherein the second bit line is interposed between the $V_{CC}$ voltage supply line and the second ground line.

15. The static memory cell structure according to claim 1, wherein the PU-1 transistor and the PU-2 transistor are PMOS transistors, while the PD-1 transistor and the PD-2 transistor are NMOS transistors.

\* \* \* \* \*